United States Patent
Höhn et al.

(10) Patent No.: US 7,288,606 B2
(45) Date of Patent: *Oct. 30, 2007

(54) TRANSPARENT LIQUID RESIN MATERIAL FOR SMT-ENABLED LED-APPLICATIONS AT HIGHER TEMPERATURES AND HIGHER LUMINOSITIES

(75) Inventors: Klaus Höhn, Taufkirchen (DE); Günter Waitl, Regensburg (DE); Karlheinz Arndt, Regensburg (DE)

(73) Assignee: Osram GmbH, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/305,402

(22) Filed: Dec. 16, 2005

(65) Prior Publication Data

US 2006/0100397 A1    May 11, 2006

Related U.S. Application Data

(63) Continuation of application No. 10/048,667, filed as application No. PCT/DE00/02614 on Aug. 4, 2000, now Pat. No. 7,009,008.

(30) Foreign Application Priority Data

Aug. 4, 1999  (DE) ................. 199 36 605

(51) Int. Cl.
*B05D 5/06*  (2006.01)
*C08L 63/02*  (2006.01)
*C08L 63/04*  (2006.01)

(52) U.S. Cl. ....................... 525/508; 427/162; 523/427

(58) Field of Classification Search ................. None
See application file for complete search history.

(56) References Cited

U.S. PATENT DOCUMENTS 4,178,274 A    12/1979  Denk et al.
4,701,481 A    10/1987  Bogan et al.
7,009,008 B1 *  3/2006  Hohn et al. ............... 525/508

FOREIGN PATENT DOCUMENTS

| DE | 26 42 465 | 8/1978 |
| DE | 31 51 540 | 8/1982 |
| DE | 32 41 767 | 5/1984 |
| EP | 0 599 600 | 6/1994 |
| GB | 2 090 257 | 7/1982 |

OTHER PUBLICATIONS

Abstract of Japanese Published Application 61-152723 (Jul. 11, 1986), Patent Abstracts of Japan, vol. 010, No. 355 (C388), Nov. 29, 1986.

Abstract of Japanese Published Application 9-176282 (Jul. 8, 1997), Patent Abstracts of Japan, vol. 1997, No. 11, Nov. 28, 1997.

* cited by examiner

*Primary Examiner*—Robert Sellers
(74) *Attorney, Agent, or Firm*—Cohen Pontani Lieberman & Pavane LLP

(57) ABSTRACT

A casting resin compound as an assembly and encapsulation material for electronic and optoelectronic component parts, modules and components, for example for casting out optoelectronic components on the basis of acid anhydride-curable epoxy compounds, particularly bisphenol A-diglycidyl ether, contains multi-functional epoxy novolak resins, particularly an epoxy cresol novolak. This casting resin compound exhibits a clearly increased glass transition temperature, is suitable for mass-production, exhibits no health deteriorations, and supplies SMT-capable products that can be utilized in the automotive sector.

13 Claims, No Drawings

TRANSPARENT LIQUID RESIN MATERIAL FOR SMT-ENABLED LED-APPLICATIONS AT HIGHER TEMPERATURES AND HIGHER LUMINOSITIES

CROSS REFERENCE TO RELATED APPLICATIONS

This application is a continuation of U.S. patent application Ser. No. 10/048,667 which was filed with the U.S. Patent and Trademark Office on Jun. 14, 2002, now U.S. Pat. No. 7,009,008 based on PCT/DE00/02614 filed on Aug. 4, 2000. Priority is claimed for this invention and application, corresponding application(s) having been filed in Germany on Aug. 4, 1999, No. 199 36 605.5.

BACKGROUND OF THE INVENTION

Field of the Invention

The invention is directed to a transparent casting resin compound for casting out optoelectronic components.

Opto-electronic components must be protected against adverse environmental influences to be functionally reliable and to have dependable utilization with up to 100,000 operating hours. Due to advantageous thermal-mechanical as well as electrical characteristic, high-purity epoxy resins are often utilized in electrical engineering and electronics. Epoxy resins have an extraordinarily high chemical stability for plastics and are therefore employed for the encapsulation of light-emitting diodes (LEDs) at operating temperatures of currently up to 110° C. The transparent and non-yellowing duromer materials exhibit glass transition temperatures of usually up to 120° C. With increasing power density and integration density in the field of opto-electronics, crack-resistant, highly loadable compounds of epoxy resin shaped materials having glass transition temperatures of above 130° C. are demanded. In addition to increased operating temperatures, the quality standards must be qualified under aggravated temperature cycles and temperature shock conditions for innovative LED applications in the automotive sector. The encapsulation materials must be completely cured in any case in order to avoid electrical degradation of the component during operation.

The epoxy casting resin shaped materials disclosed by DE 2642465 composed of cycloaliphatic casting resin mixtures with epoxies of the glycidylether type exhibit high glass transition temperatures>130° C. but appear unsuitable for fabrication use because of possibly excessively high health risks. Toxilogical investigations, which were made by leading institutions of these resin mixtures, yielded a substantiated suspicion of pronounced carcinogenic potential in this context.

DE 32 41 767 A1 discloses a colored casting compound on the basis of cycloaliphatic and aromatic epoxies and carboxylic acid anhydride hardening agents are known that are distinguished by their good color stability and that are proposed for optical applications.

SMD-LEDs are currently encapsulated with two-component, thermally cross-linking reaction resins on a basis of anhydride-epoxy casting resin. The optimized rheological and thermally reactive properties of the casting compound allow cost-efficient mass production processes. The epoxy resin component is composed of a moderately viscous bisphenol-A-diglycidylether with reactive epoxy diluent, and anti-foaming mixture as well as a pigment batch that enables transparent shaped materials after the hardening step. This A-component can be laced further with low-molecular alcohols. Pigments that can be distributed with molecular dispersion are utilized for pigmentation. Diffusely light-emitting components are utilized by adding specific diffuser pastes on the basis of inorganic pigments. Different zinc-salt accelerated anhydrides are modified with acidic ester upon addition of oxidation stabilizers for the hardener component. With existing casting compound, the increase in quality features of future LED generations, however, cannot be adequately satisfied in view of a temperature range of utilization and a thermal fatigue resistance according to automotive standards.

SUMMARY OF THE INVENTION

It is therefore an object of the present invention to specify a casting resin compound that exhibits a greater utilization temperature range, particularly a higher glass transition temperature, and also exhibits low health risks at the same time.

Further, the products manufactured therewith should be capable of being employed in all standard soldering methods and should assure short hardening cycles in mass-production processes. For light-emitting diodes having high luminosities, transparent shaped materials that are color-stable both thermally as well as photo-chemically are required.

This object is achieved with a transparent casting resin compound for casting out optoelectronic components on the basis of an acid anhydride-curable epoxy compound. The resin is produced by mixing from an A-component, a B-component, in the weight ratio of a range from 100:100 to 100:80, and, optimally, a further additive. The resin has a viscosity at 25° C. of less than 3000 mPas and has a glass transition temperature of the shaped material resulting therefrom of above 130° C. A-component is composed of a mixture of at least one epoxy compound comprising a diglycidyl ether of bisphenol-A, with the prescription that cycloaliphatic epoxy compounds are excluded and at least one epoxy novolak resin as a multi-functional epoxy with a proportion of 20-50 weight % in the A-component. The B-component comprises a zinc salt accelerator and contain a carboxylic acid anhydride, such as hexahydrophthalic acid anhydride. In accordance therewith, the invention discloses a transparent casting resin compound as an encapsulation and assembly material for casting out opto-electronic components on the basis of an acid anhydride-curable epoxy compound that is produced by mixture of an A-component composed of at least one epoxy compound and at least one multiple-functional epoxy novolak resin, and, potentially, of further additives, and a B-component composed of at least one carboxylic acid anhydride.

The inventive transparent epoxy casting resin formulations can be advantageously processed in an established packaging technology and meet the optical, electrical and thermal-mechanical quality demands of future product generations in opto-electronics, and particularly exhibit glass transition temperatures above 130° C. The toxic risk potential of the initial materials is low based on the state of current knowledge, so that health risks can be precluded insofar as possible.

Systematic investigations of the fundamental regarding the development of low-stress plastic composites in electronics have shown that the glass transition temperatures of epoxy resin molded materials curable by an anhydride on a basis of bisphenol-A-epoxy resin were capable of being clearly enhanced by the addition of multi-functional epoxy novolak resins. It was also observed that such novolak structures contribute to the reduction of the shrinkage during the processing and improve the mechanical properties. The linearly crack-elastic $K_{IC}$ values and $G_{IC}$ values can likewise be enhanced. What are also the beneficial adhesion values of the high-strength dormer materials in shear tension tests (DIN 53283) were beneficial preconditions for the use of the epoxy novolak resins in opto-electronics, because it was also found that temperature-stable and yellowing-resistant reaction resin shaped materials could be thus manufactured. Since epoxy novolak resins have viscosity or, respectively, are solid, the rheological properties of corresponding formulations had to be adapted to the requirements in casting resin technology. In addition, it was also necessary to adapt the reactive behavior in view of the manufacture compatibility and required glass transition temperature.

The A-component preferably comprises further additives such as a reactive diluent, an alcohol, an adhesion-promoting agent, a flow improver, an agent for degasification, a diffuser paste, and a component for setting the color quotient/pigmentation.

DESCRIPTION OF THE PREFERRED EMBODIMENT

Accordingly, an inventive epoxy casting resin component is preferably composed in the following way:

| | |
|---|---|
| Multi-functional epoxy casting resins: (Bisphenol-A-diglycidylether) | <80 weight % |
| Epoxy cresol novolak: | <50 weight % |
| Reactive diluent: (Monoglycidylether) | <10 weight % |
| Alcohol: | <10 weight % |
| Diffuser paste (pigment in epoxy casting resin) | <10 weight % |
| Adhesion promoter: | <5 weight % |
| Flow improver: (silicone basis) | <1 weight % |
| Degasification agent: (silicone basis) | <1 weight % |
| Component for setting the color quotient/pigmentation: (pigment in epoxy casting resin) | <1 weight % |
| Internal parting compound: (silicone basis) | <1 weight %. |

As in DE 26 42 465, the carboxylic acid anhydride can, for example, be a hexahydrophthalic acid anhydride.

The glass transition temperatures of a shaved material, which is composed of the aforementioned exemplary embodiment having a mixing ratio A:B of 100:90, amounts to 140° C. 135° C. were obtained for the component under manufacturing conditions. All function-specific and component-specific qualifications according to the most current standards of automotive electronics were met.

A specific exemplary embodiment for the A-component is recited below:

| | |
|---|---|
| D.E.R. 332 (Dow Chemical): (bisphenol-A-diglycidylether) | 78.96 weight % |
| D.E.N. 438 (Dow Chemical): (epoxy Novolak) | 20.00 weight % |
| BYK-A506 (BYK Chemie GmbH) a solution of foam destroying polysiloxanes: (Degasification agent) | 0.20 weight % |
| Silane A187 (OSi Specialities) γ-glycidoxypropyltrimethyoxysilane: (adhesion promoter) | 0.80 weight % |
| Masterbatch 09 (CIBA Specialties): (setting the color) | 0.05 weight %. |

This exemplary embodiment exhibits the following technical characteristics and shaped material properties:

| | |
|---|---|
| Viscosity of the A:B mixture: (plate cone, 25° C., D = 500 1/s) | 1250 mPas |
| Use duration at 30° C. | 8 h |
| Glass transition temperature (DSC, 10 K/min) | 135 ± 5° C. |
| Shore hardness D | 86-88 |
| Water absorption: (stored for two weeks in water at 23° C.) | <0.5 weight % |
| Bending modulus (DIN53452) | 2750 MPa |
| Flexural strength (DIN53452) | 150 MPa |
| Flexibility at crack (DIN 53452) | 7.2% |
| Transmission at 500 nm: (1 mm shaped material thickness) | >88% |
| Color interval after shaped material aging: (6 weeks at 120° C.) | 4.6 |
| Loss of mass up to 300° C.: (TG/DTA, 10 K/min, nitrogen) | <2%. |

Further typical parameters, properties and settings of the aforementioned products and pre-products are:

The viscosity of the epoxy resin component is <15,000 mPas at 25° C.

The viscosity of the A:B reaction resin mixture is 3,000 mPas at 25° C.

The shelf life of the epoxy casting resin component amounts to at least one year at temperatures up to 30° C.

The use duration of the A:B reaction resin mixture amounts to at least six hours at 25° C.

The beneficial reactive behavior of the A:B reaction resin mixture allows fast curing cycles given dependable component casting in mass-production processes having unit numbers of more then 100 million per year.

The glass transition temperature of the shaped materials is >130° C.

The water absorption after two weeks being stored in water at 23° C. is <0.5 weight %.

The transmission of a 1 mm thick shaped material in the visible range of light amounts to >88%.

The color shift after thermal aging at 130° C. after six weeks is <10.

The lenses manufactured with the resin proved radiation-resistant in high-intensity LEDs having, for example, 1.4 lm/50 mA. The present development of shaped material is distinguished by extraordinary fracture-mechanical properties with $K_{IC}$ 1.34 MPa/m and $G_{IC}$ 577 J/m² and the products encapsulated with the resin can be utilized in all SMT processes and—over and above this—are suited for applications in the automotive sector (Tg>130° C.!).

The bulk degradation up to 300° C. is <2% (thermal scale, 10 K/min, nitrogen).

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

What is claimed is:

1. A transparent casting resin compound, said compound comprising:

a mixture of an A-component and a B-component in a weight ratio in a range of 100:100 through 100:80, said resin compound having a viscosity at 25° C. of less than 3000 mPas and having a glass transition temperature of the shaped material resulting therefrom of above 130° C.;

said A-component comprising a mixture of a diglycidyl ether of bisphenol-A, with the prescription that cycloaliphatic epoxy compounds are excluded, and one epoxy novolak resin as a multi-functional epoxy with a proportion of 20-50 weight % in the A-component as the only epoxy components of the A-component; and said B-component comprising a zinc salt accelerator and containing at least one carboxylic acid anhydride.

2. A transparent casting resin compound according to claim 1, wherein the epoxy novolak resin is an epoxy cresol novolak.

3. A transparent casting resin compound according to claim 1, whereby the A-component comprises the following percentage composition:

| | |
|---|---|
| epoxy compound: | <80 weight % |
| Epoxy novolak resin: | 20-50 weight % |
| Reactive diluent: | <10 weight % |
| Alcohol: | <10 weight % |
| Diffuser paste | <10 weight % |
| Adhesion promoter: | <5 weight % |
| Flow improver: | <1 weight % |
| Degasification agent: | <1 weight % |
| Pigment in epoxy casting resin: | <1 weight %; and |
| Internal parting compound | <11 weight %. |

4. A transparent casting resin compound according to claim 3, wherein the B-component contains 2 through 10 weight % zinc salt accelerator.

5. A transparent casting resin compound according to according to claim 1, wherein the A-component comprises the following percentage composition:

| | |
|---|---|
| bisphenol-A-diglycidylether | 78.96 weight %; |
| epoxy novolak | 20.00 weight %; |
| Degasification agent | 0.20 weight %; |
| adhesion promoter | 0.80 weight %; and |
| an agent for setting the color | 0.04 weight %. |

6. A transparent casting resin compound according to claim 1, wherein the B-component is of a nature so that the specific acceleration allows hardening cycles in the range of minutes for mass-production processes.

7. A transparent casting resin compound according to claim 1, wherein the B-component contains 2 through 10 weight % zinc salt accelerator.

8. A transparent casting resin compound according to claim 1, wherein opto-electronic components include modules.

9. A transparent casting resin compound according to claim 8, wherein the component includes optoelectronic couplers, light-emitting diodes, phototransistors, photodiodes and light-emitting diode displays.

10. A method for utilizing a transparent casting resin compound for encapsulating, covering or enveloping a device comprising:

providing the device;

preparing the transparent casting resin compound comprising a mixture of an A-component, a B-component and additives, in a weight ratio in a range of 100:100 to 100:80, said compound having a viscosity of less than 3000 mPas at 25° C. and having a glass transition temperature in a cured state above 130° C., said A-component comprising a mixture of a diglycidyl ether of bisphenol-A with all cycloaliphatic epoxy compounds being excluded, and one epoxy novolak resin as a multi-functional epoxy with a proportion of 20-50 weight % as the only epoxy component in the A-component, and the B-component comprising a zinc salt accelerator and at least one carboxylic acid anhydride; and coating at least a part of the device.

11. A method according to claim 10, wherein the step of coating forms a light guide resin for an opto-electronic coupler.

12. A method according to claim 10, wherein the device to be provided are opto-electronic components.

13. A method according to claim 10, wherein the device to be provided is selected from the group consisting of light-emitting diodes, phototransistors, photodiodes and light-emitting diode displays.

* * * * *